United States Patent [19]
Yamaguchi et al.

[11] Patent Number: 5,369,661
[45] Date of Patent: Nov. 29, 1994

[54] SEMICONDUCTOR LASER-PUMPED SOLID STATE LASER SYSTEM AND OPTICAL COUPLING SYSTEM COUPLING SEMICONDUCTOR LASER WITH OPTICAL FIBER

[75] Inventors: Satoshi Yamaguchi; Hirofumi Imai, both of Sagamihara, Japan

[73] Assignee: Nippon Steel Corporation, Tokyo, Japan

[21] Appl. No.: 828,347

[22] Filed: Jan. 30, 1992

[30] Foreign Application Priority Data

Feb. 7, 1991 [JP] Japan .................. 3-036575

[51] Int. Cl.⁵ .................................. H01S 3/09
[52] U.S. Cl. ............................... 372/69; 372/101; 372/6; 372/71; 372/98; 372/75
[58] Field of Search .................... 372/69–71, 372/98, 6, 75, 106, 101

[56] References Cited

U.S. PATENT DOCUMENTS

| | | | |
|---|---|---|---|
| 4,553,238 | 11/1985 | Shaw et al. | 372/70 |
| 4,656,635 | 4/1987 | Baer et al. | 372/71 |
| 4,710,940 | 12/1987 | Sipes, Jr. | 372/69 |
| 4,713,822 | 12/1987 | Lee | 372/69 |
| 4,739,507 | 4/1988 | Byer et al. | 372/71 |
| 4,780,877 | 10/1988 | Snitzer | 372/69 |
| 4,785,459 | 11/1988 | Baer | 372/70 |
| 4,791,631 | 12/1988 | Baumert et al. | 372/69 |
| 4,794,615 | 12/1988 | Berger et al. | 372/69 |
| 4,813,762 | 3/1989 | Leger et al. | 372/71 |
| 4,956,843 | 9/1990 | Akhavan-Lellabady et al. | 372/71 |
| 4,974,230 | 11/1990 | Hemmati | 372/71 |
| 4,995,050 | 2/1991 | Woarts et al. | 372/99 |
| 5,014,279 | 5/1991 | Esterowitz et al. | 372/71 |
| 5,031,182 | 7/1991 | Anthon et al. | 372/71 |
| 5,048,030 | 9/1991 | Hiiro | 372/68 |
| 5,081,637 | 1/1992 | Fan et al. | 372/101 |
| 5,124,999 | 6/1992 | Okazaki et al. | 372/69 |
| 5,212,707 | 5/1993 | Heidel et al. | 372/101 |

FOREIGN PATENT DOCUMENTS

| | | |
|---|---|---|
| 58-52889 | 3/1983 | Japan . |
| 60-25444 | 2/1985 | Japan . |
| 62-88386 | 4/1987 | Japan . |
| 62-237784 | 10/1987 | Japan . |

OTHER PUBLICATIONS

Shannon et al; "High-Power Nd:YAG Laser-End Pumped by a cw 10 mm×1 μm Aperture 10-W Laser-Diode Bar"; Optics Letters vol. 16, No. 5, Mar. 1, 1991.

R. Burnham and A. D. Hays, High-power diode-array-pumped frequency-doubled cw Nd:YAG laser, Jan. 1, 1989, 27–29.

D. C. Shannon and R. W. Wallace, High-power Nd:YAG laser end pumped by a cw, 10 mm×1 μm aperture, 10-W laser diode bar, Mar. 1, 1991, 318–320.

S. C. Tidwell, et al., Efficient, 15-W output power, diode-end-pumped Nd:YAG laser, Apr. 15, 1991, 584–586.

Primary Examiner—Léon Scott, Jr.
Attorney, Agent, or Firm—Kenyon & Kenyon

[57] ABSTRACT

Light beams output from active layer stripes of a semiconductor laser array are individually collimated in a GRIN lens array and are converged, in a aspheric lens, into a beam spot, to thereby end-pump a solid state laser with high efficiency.

21 Claims, 9 Drawing Sheets

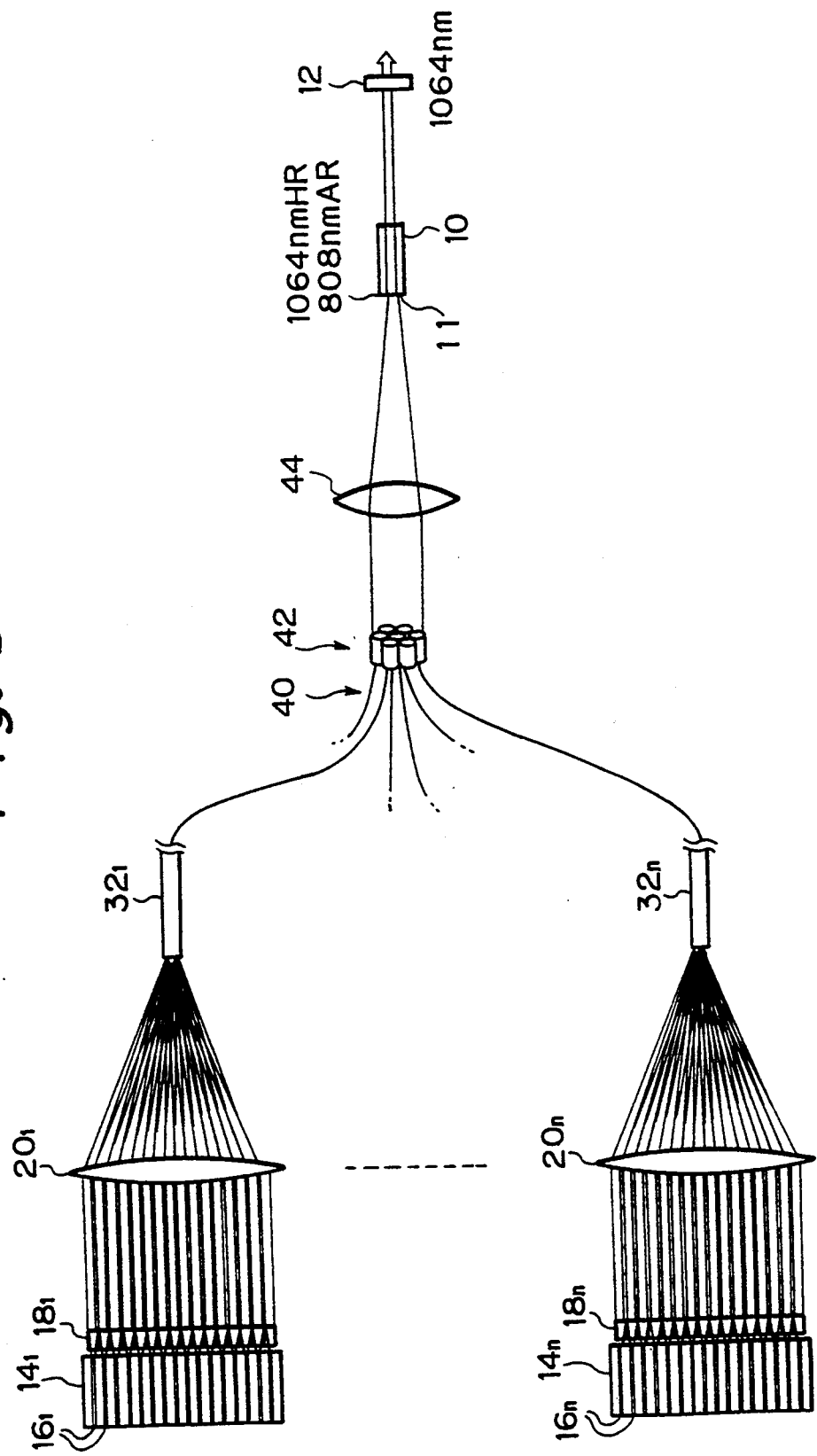

SEMICONDUCTOR LASER-PUMPED SOLID STATE LASER SYSTEM AND OPTICAL COUPLING SYSTEM COUPLING SEMICONDUCTOR LASER WITH OPTICAL FIBER

BACKGROUND OF THE INVENTION

1. Field of the Invention

The present invention relates to a semiconductor laser-pumped solid state laser system wherein an optical power from a semiconductor laser array as a pump source is optically coupled with a solid state laser element in high efficiency, and an optical coupling system for coupling an optical power from a semiconductor laser array with an optical fiber with high efficiency.

2. Description of the Related Art

A solid state laser using a semiconductor laser as a light source for optical pumping has attracted much attention because of its high efficiency, long life, and its potential miniaturization. Among the pumping methods of the solid state laser with the semiconductor laser, an end-pumping method wherein the solid state laser is pumped in the direction of its optical axis (e.g., Japanese Unexamined Patent Publication (Kokai) No. 58-528), realizes single fundamental transverse mode oscillation with high efficiency by matching the pump space of an optical power from the semiconductor laser with a spatial mode of the oscillation in the solid laser.

To obtain high output power from the semiconductor laser-pumped solid state laser, a light beam of the semiconductor laser must be sufficiently condensed and a semiconductor laser generating high optical power must be used.

Meanwhile, the optical power of a semiconductor laser, which is supplied through an optical fiber, has been widely used, for example, in the field of medical science. The optical power supplied through the optical fiber is obtained by optically coupling the semiconductor laser with the optical fiber. Again, to obtain high optical power from the optical fiber, the condensing of the optical power from the semiconductor laser and high output power from the semiconductor laser is important.

However, it is not easy to condense the optical power from the semiconductor laser because the divergence angle of the light beam of the semiconductor laser is large, and therefore, a condensing system must be located close to the semiconductor laser.

Furthermore, in the semiconductor laser, the laser beam is generated in a striped active layer, and since the optical power from a single striped laser is limited, a plurality of stripes having an array construction i.e., a semiconductor laser array has to be used to obtain the higher optical power.

Since the width of the semiconductor laser array generating an optical power sufficient for effecting the end-pumping amounts to 1 cm, a plurality of light beams cannot be condensed at a spot using a conventional lens system, and therefore the semiconductor laser array has not been employed in the end-pumping method efficiently, but has only been employed in a side-pumping method (for example, R. Burnham and A. D. Hays, Opt. Lett., 14, 27(1989); M. K. Reed, W. J. Kozlovsky, R. L. Byer, G. L. Harnagel, and P. S. Cross, Opt. Lett., 13. 204(1988).)

SUMMARY OF THE INVENTION

Therefore, it is an object of the present invention to provide a semiconductor laser array-pumped solid state laser system, wherein a plurality of light beams having a large divergence angle generated in a semiconductor laser array having multiple stripes are condensed so that a pump space of an optical power from the semiconductor laser array matches a space mode of oscillation of the solid state laser, to thereby generate a highly efficient optical power in the solid state laser.

It is another object of the present invention to provide an optical coupling system for coupling an optical power from the semiconductor laser array with an optical fiber of high efficiency.

In accordance with the present invention, there is provided a semiconductor laser-pumped solid state laser system comprising a resonator means including a solid state laser, a semiconductor laser means having a plurality of active portions for outputting a plurality of light beams, respectively, a condensing means, optically coupled with the semiconductor laser means, for condensing the respective light beams from the respective active portions of the semiconductor laser means, and a converging means, optically coupled with the condensing means, for converging the light beams condensed in the condensing means, to thereby optically pump the solid state laser.

In accordance with the present invention there is also provided an optical coupling system for coupling a semiconductor laser with an optical fiber; the semiconductor laser element having a plurality of active portions for outputting a plurality of light beams, respectively, comprising a condensing means, optically coupled with the semiconductor laser element for condensing the respective light beams from the respective active portions of the semiconductor laser elements, and a converging means optically coupled with the condensing means and coupled with the optical fiber for converging the light beams condensed in the condensing means and for supplying the optical fiber with the converged light beams.

BRIEF DESCRIPTION OF THE DRAWINGS

FIG. 9 is a schematic diagram of a semiconductor laser array-end-pumped solid state laser system according to another embodiment of the present invention;

DESCRIPTION OF THE PREFERRED EMBODIMENTS

Figure 1:
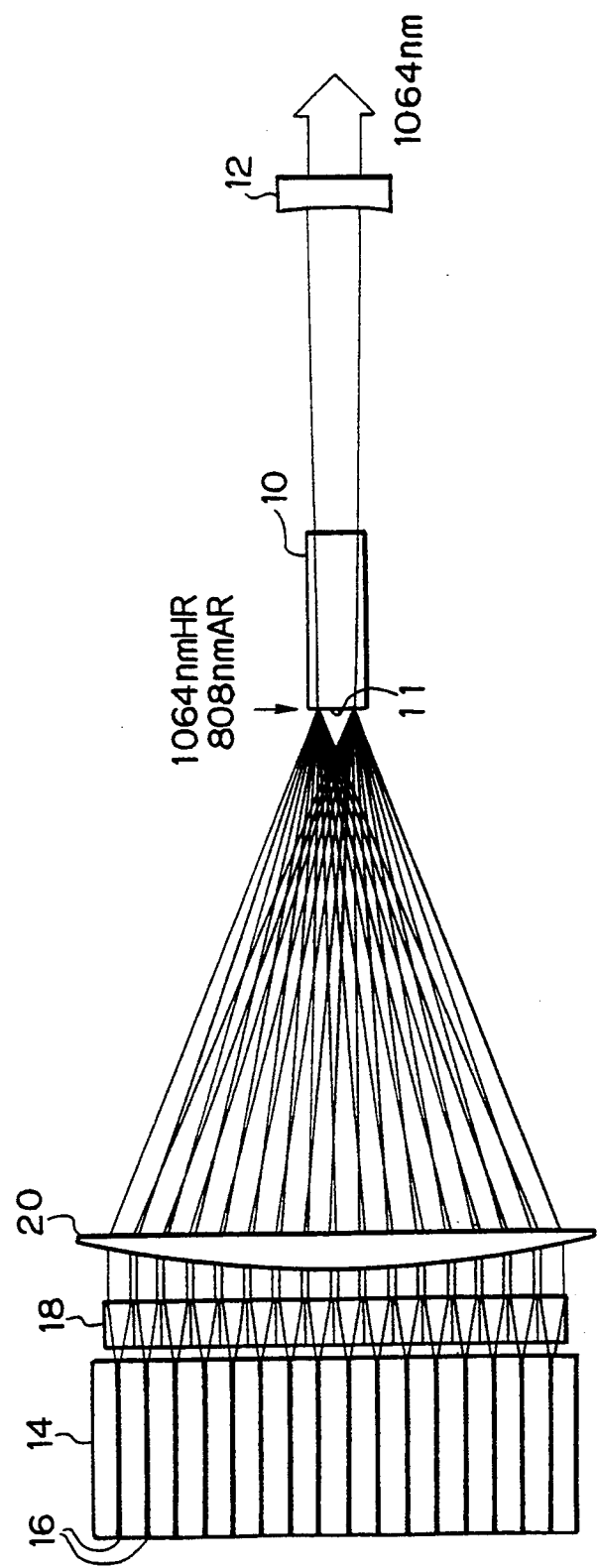
FIG. 1 is a schematic diagram of a semiconductor laser array-end-pumped solid state laser system according to an embodiment of the present invention.

FIG. 1 is a schematic diagram of a semiconductor laser array-end-pumped solid state laser system according to an embodiment of the present invention. As shown in FIG. 1, a resonator is constructed by a solid state laser 10 including a Nd:YAG laser, and an output mirror 12. A dychroic coating is applied to one end face 11 of the solid state laser 10 to render the face highly reflective (HR) at a wavelength 1064 nm of oscillation of the Nd:YAG laser and to make the face anti-reflective (AR) at a wavelength 808 nm of the semiconductor laser array. The end face 11 is used as a pump face. A used semiconductor laser array 14 has 20 active layer stripes 16 having a width of 100 $\mu$m and spaced at intervals of 500 $\mu$m. A gradient index lens (GRIN lens) array 18 as a condenser lens array is constructed by 20 GRIN lenses having widths of 500 $\mu$m to condense light beams from the 20 stripes to form 20 parallel beams, respectively. The 20 parallel laser beams are converged by an aspherical lens 20, and are superimposed on the end face 11 to end-pump the Nd:YAG laser 10.

Characteristics of a transverse mode in a semiconductor laser-pumped solid state laser is determined by the shape of the pump space inside a solid state laser element. Therefore, it is important to approach the intensity distribution of the condensed pumping light to the Gaussian distribution and stably form a beam spot having a constant size the inside the solid state laser element, in order to obtain a fundamental transverse mode.

Since the GRIN lens, which is optical glass having a refractive index distribution where the refractive index is gradually reduced from the central axis to periphery, is used as an optical coupler for the semiconductor laser-pumped solid state laser, the laser beam having the large divergence angle from the semiconductor laser can be easily condensed. And, since the condensed laser beams are converged into a beam spot by the aspherical lens, which does not cause spherical aberration, to pump the solid state laser, a high quality fundamental transverse mode light beam is obtained.

In the semiconductor laser array-pumped solid state laser system, which is end-pumped in the aforementioned condition, a fundamental transverse mode oscillation of the Nd:YAG laser (wavelength 1064 nm) is obtained through the output mirror 12 with high output power of 1.5 W, under 5 W of output power of the semiconductor laser array (wavelength 808 nm).

Figure 2:
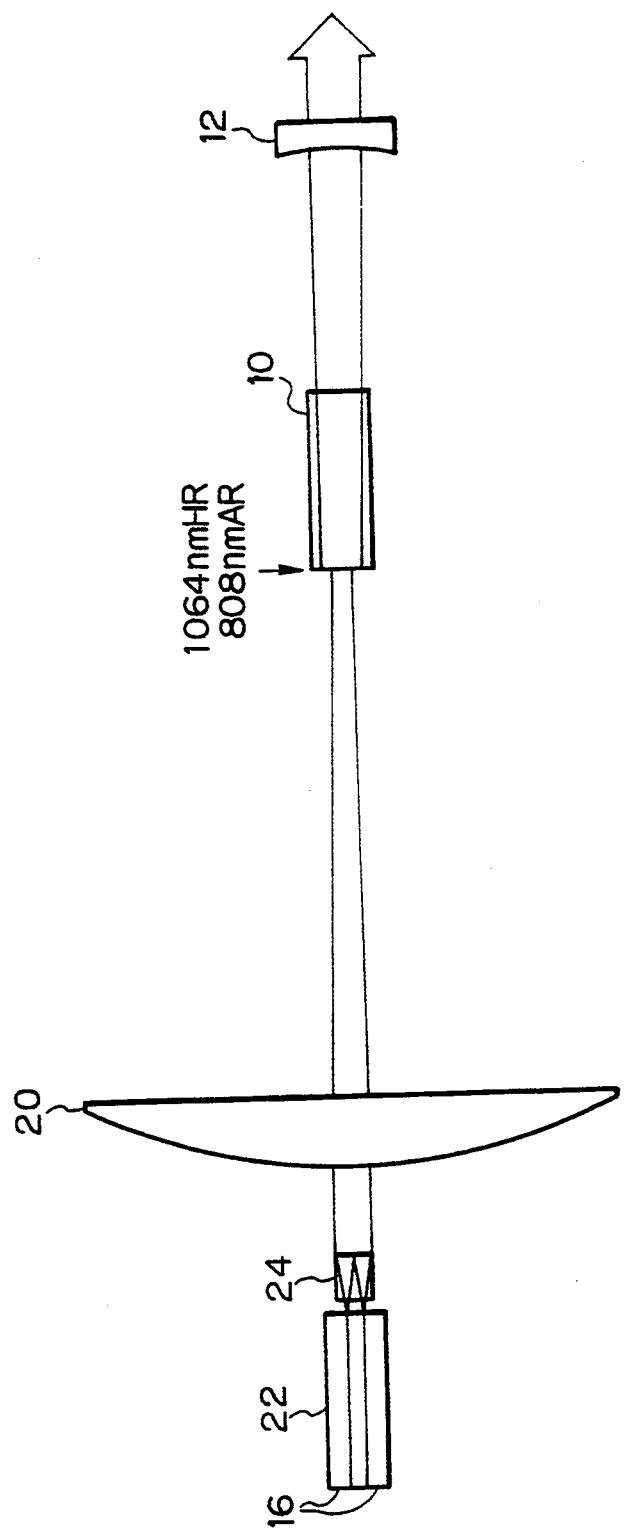
FIG. 2 is a schematic diagram of a semiconductor laser array-end-pumped solid state laser system according to another embodiment of the present invention.

FIG. 2 is a schematic diagram of a semiconductor laser array stack-end-pumped solid state laser system according to another embodiment of the present invention. The used semiconductor laser array stack 22 is made by stacking two semiconductor laser arrays 14, as described with reference to FIG. 1, at intervals of 300 $\mu$m. A GRIN lens array stack 24 as a condenser lens array stack is made by stacking two GRIN lens arrays 14 (FIG. 1) under central axes thereof coincident with that of the semiconductor laser array stack 22. The GRIN lens array stack 24 condenses light beams from 40 stripes 16 of the semiconductor laser array stack 22, to form 40 parallel light beams, respectively.

In the semiconductor laser array-pumped solid state laser system of FIG. 2, a fundamental transverse mode oscillation of the Nd:YAG laser (wavelength 1064 nm) has been obtained with high output power of 3 W, under 10 W of output power from the semiconductor laser array stack (wavelength 808 nm).

Figure 3:
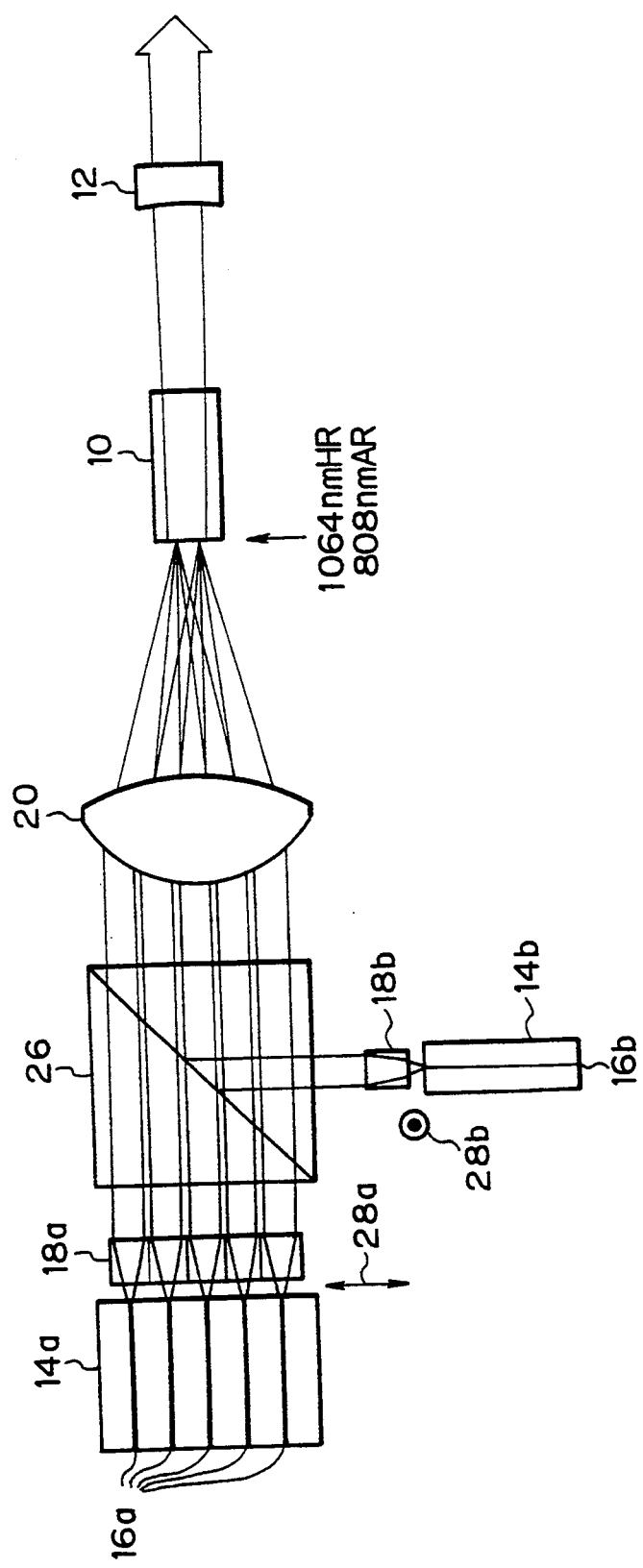
FIG. 3 is a schematic diagram of a semiconductor laser array-end-pumped solid state laser system according to another embodiment of the present invention.

FIG. 3 is a schematic diagram of a semiconductor laser array-end-pumped solid state laser system according to another embodiment of the present invention.

In this embodiment, a polarization beam splitter 26 is used for beam mixing two light beam groups from two semiconductor laser arrays 14a and 14b for optical pumping. As the light beam from the semiconductor laser is polarized, the polarization beam splitter 26 can mix the two polarized light beams. As denoted by an arrow 28a and a mark 28b, oscillation of a light beam group from the first semiconductor laser array 14a is polarized in a direction parallel to the surface of the drawing and oscillation of another light beam group from the second semiconductor laser array 14b is polarized in a direction normal to the surface of the drawing. Two light beam groups from the first and the second semiconductor laser array 14a and 14b are condensed by first and second GRIN lens arrays 18a and 18b, respectively, and are mixed in the polarization beam splitter 26. The mixed light beam group is converged into a beam spot by the aspherical lens 20 inside the Nd:YAG laser 10 as a solid state laser element.

Note that, if a halfwave plate inserted between one of the semiconductor laser arrays 14a and 14b and the polarization beam splitter 26 is used, required polarization directions of the two semiconductor arrays 14a, 14b become the same. Such a construction is convenient, for example, in the case where spatial interference must be avoided in assembling.

The used semiconductor arrays 14a and 14b are the same as the semiconductor array 14 of FIG. 1. Also, the GRIN lens arrays 18a, 18b are the same as the GRIN lens array 18 of FIG. 1.

In the above-mentioned semiconductor laser array-end-pumped solid state laser system, a fundamental transverse mode oscillation of the Nd:YAG laser has been obtained with a high output power of 3 W, under 10 W of output power of the semiconductor laser.

Figure 4:
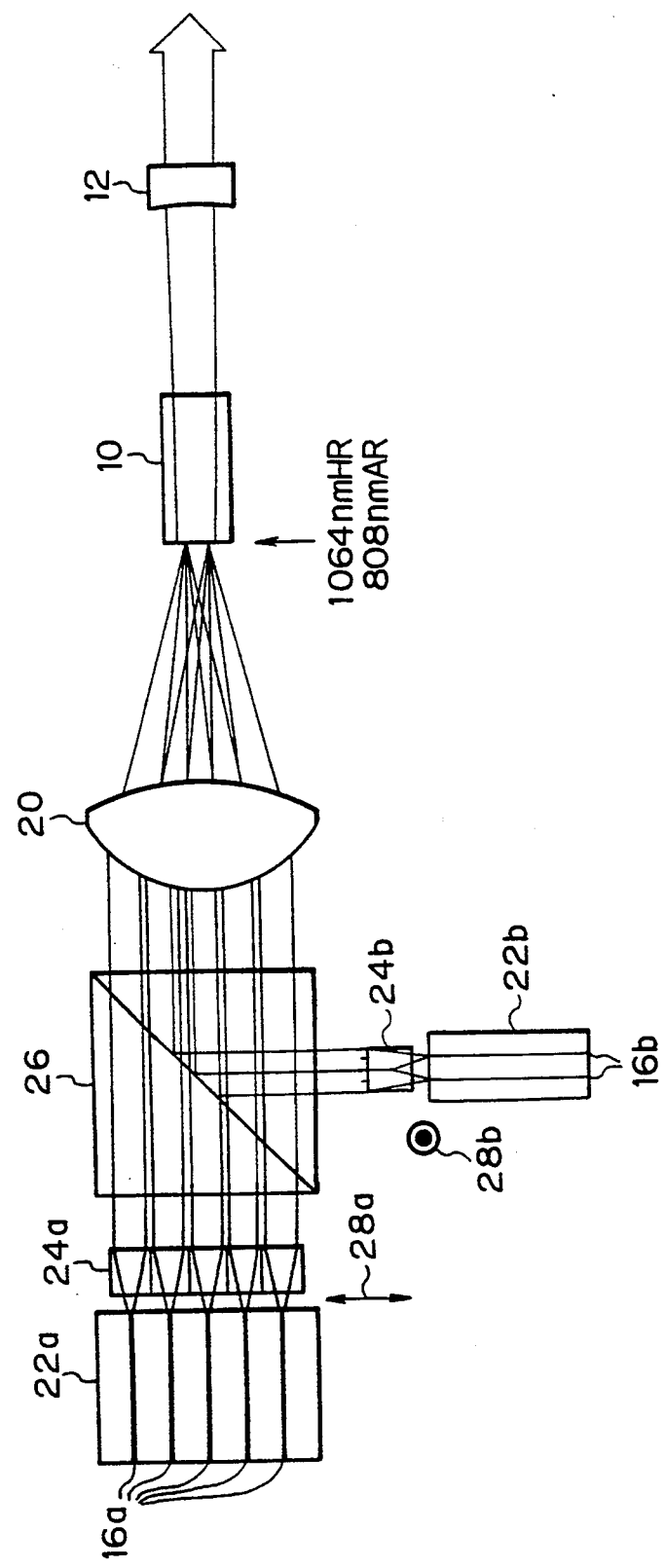
FIG. 4 is a schematic diagram of a semiconductor laser array-end-pumped solid state laser system according to another embodiment of the present invention.

FIG. 4 is a schematic diagram of a semiconductor laser array stack-end-pumped solid state laser system according to another embodiment of the present invention.

Used semiconductor laser array stacks 22a, 22b and GRIN lens array stacks 24a and 24b are the same as the semiconductor laser array stack 22 and the GRIN lens array stack 24 of FIG. 2, respectively. Polarization directions of the semiconductor laser array stack 22a and 22b are the same as those of the semiconductor laser arrays 14a and 14b of FIG. 3, respectively.

In the above semiconductor laser array stack-end-pumped solid state laser system, an output power of 6 W is obtained with 20 W of output power from the semiconductor laser.

Although the Nd:YAG laser element is used as the solid state laser element in the aforementioned embodiments, the present invention is, of course, not limited to this. If a solid state laser element having a different absorption wavelength from that of the Nd:YAG laser element is used, a semiconductor laser element having a wavelength suitable for maximum absorption wavelength of the solid state laser element is used. Nonreflective coatings in the wavelength of the semiconductor laser are applied on both surfaces of the lenses and the polarization beam splitters. In addition, the number of semiconductor laser arrays and the GRIN lens arrays in the semiconductor laser array stack 22 and the GRIN lens array stack 24 of FIG. 2 and 4 are not limited to two.

Figure 5:
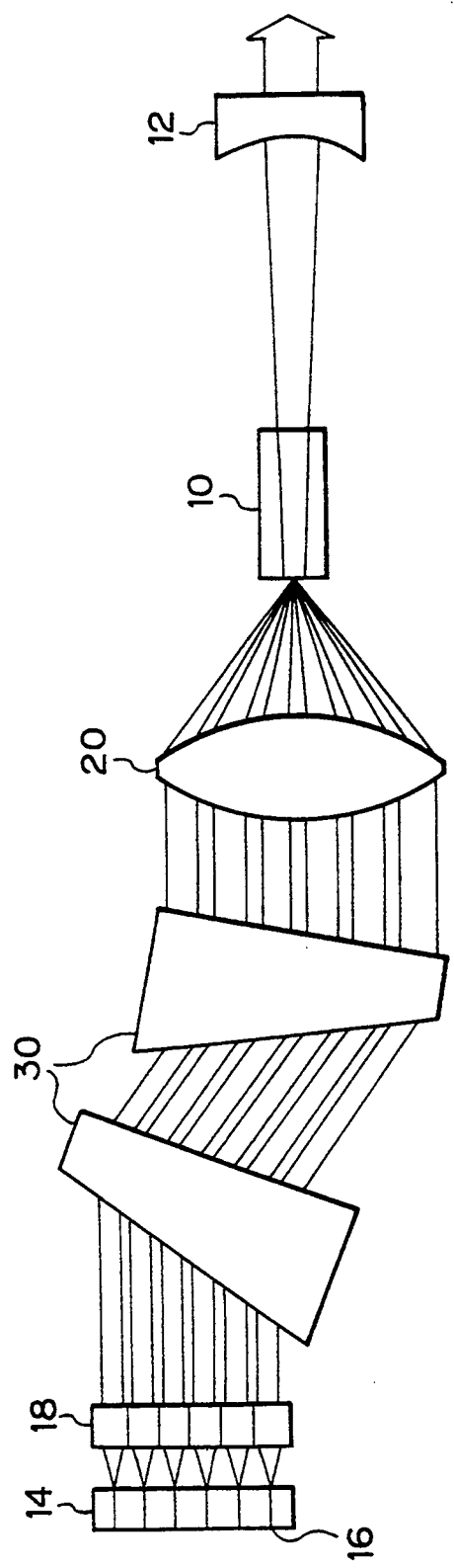
FIG. 5 is a schematic diagram of a semiconductor laser array-end-pumped solid state laser system according to another embodiment of the present invention.

FIG. 5 is a schematic diagram of a semiconductor laser array-end-pumped solid laser system according to another embodiment of the present invention.

In this embodiment, an anamorphic prism pair 30 is used between the GRIN lens array 18 and the aspherical lens 20 for shaping cross sections of the light beams from the GRIN lens array 18.

As previously mentioned, it is preferable to approach the intensity distribution of the condensed pumping light to the Gaussian distribution to obtain the fundamental transverse mode. In addition, it is preferable that the distribution is a rotation symmetrical Gaussian distribution. Nevertheless, since the divergence angle of the light beam from the active layer stripe of the semiconductor laser is larger in a direction normal to the active layer than in a direction parallel to the active layer, namely, since the cross section of the light beam generally has an elongated elliptic shape, it is difficult to approach the intensity distribution of the condensed pumping light to the rotation symmetrical Gaussian distribution.

Using the anamorphic prism pair 30 having wedge-shaped cross sections according to the present invention, the cross section of the light beam is expanded in only one direction. Therefore, the anamorphic prism pair 30 can expand the light beam having an elliptic cross section in a direction of its minor axis to approach a complete round. Thus, by shaping the light beams from the GRIN lens array 18 in the anamorphic prism pair 30 to approach the intensity distribution of the rotation symmetrical Gaussian distribution, by converging the light beams in the aspherical lens 20 to a single beam spot, and by pumping the solid state laser element 10 with the converged beam spot, a high quality transverse mode light beam is obtained.

In the semiconductor laser array-pumped solid state laser system shown in FIG. 5, an 1.11 W of YAG output (wavelength 1064 nm) is obtained under a 3.48 W of pumping input (wavelength 808 nm). The threshold level of oscillation was low, i.e., 270 mW and slope efficiency was high, i.e., maximum 42%.

Figure 6:
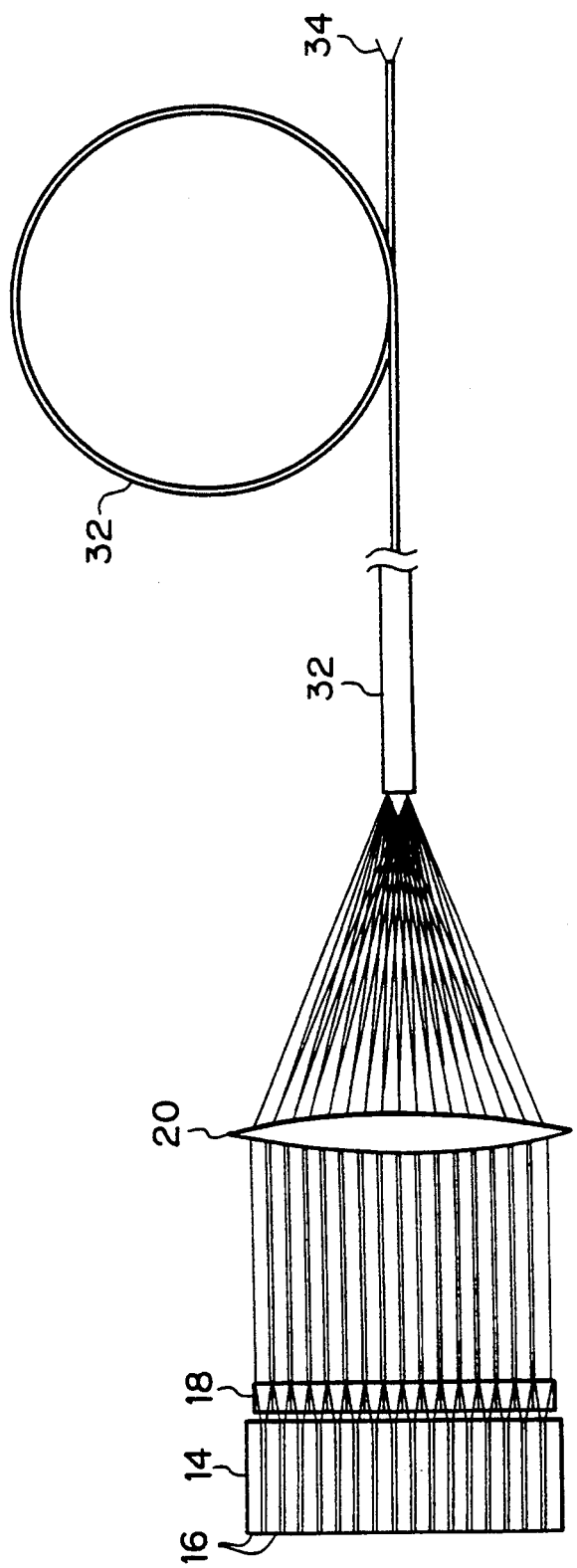
FIG. 6 is a schematic diagram of an optical coupling system for coupling a semiconductor laser array with an optical fiber according to another embodiment of the present invention.

FIG. 6 is a schematic diagram of an optical coupling system for coupling a semiconductor laser array with an optical fiber according to another embodiment of the present invention. Used semiconductor laser array 14, GRIN lens array 18, and aspherical lens 20 are the same as those of FIG. 1.

The light beams from the active stripes 16 of the semiconductor laser array 14 are collimated in the GRIN lens array 18, are converged in the aspherical lens 20 into a light beam, and then enter an optical fiber 32. As the shape of the light beam is corrected by multiple reflection in the optical fiber 32, output light 34 of the optical fiber 32 becomes a transverse mode light having a high quality with high efficiency. In the optical coupling system of FIG. 6, output power of the semiconductor laser array 14 was coupled with optical fiber 32 with a high efficiency of 54%.

Figure 7:
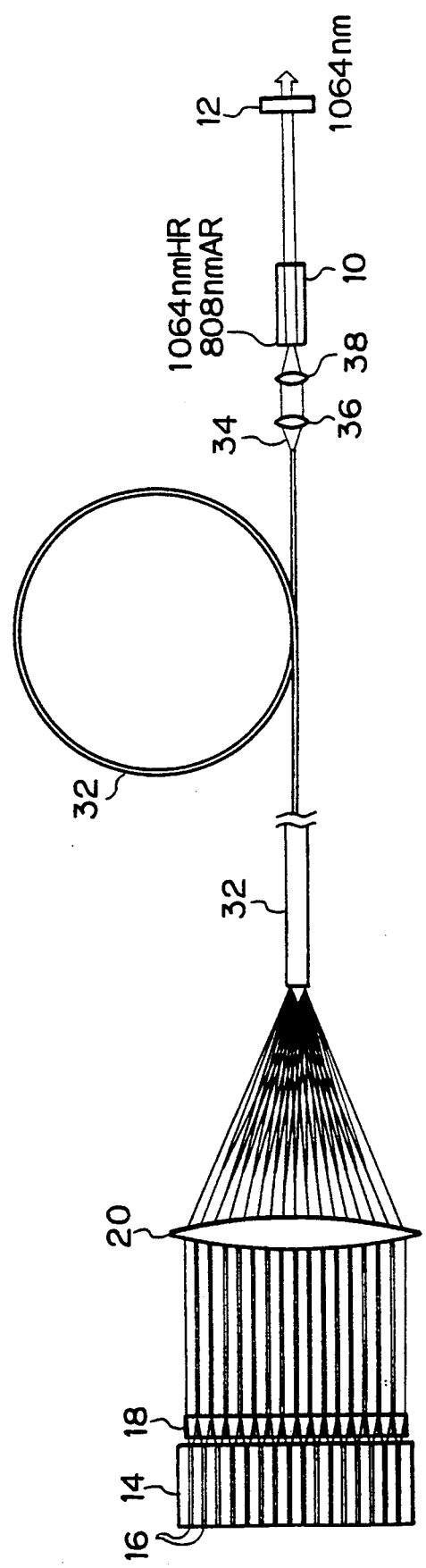
FIG. 7 is a schematic diagram of a semiconductor laser array-end-pumped solid state laser system according to another embodiment of the present invention.

FIG. 7 is a schematic diagram of a semiconductor laser array-end-pumped solid state laser system according to another embodiment of the present invention.

In this embodiment, the semiconductor laser array 14, the GRIN lens array 18, the aspherical lens 20, and the optical fiber 32 are the same as those of FIG. 6. Also the solid state laser 10 and the output mirror 12 are the same as those of FIG. 1.

As described with reference to FIG. 6, the optical power from stripes 16 of the semiconductor laser array 14 is coupled with the optical fiber 32 with high efficiency. The output light 34 which is shaped by the optical fiber 32 is collimated by a lens 36 and is converged by a lens 38 to end-pump the Nd:YAG solid state laser 10.

Figure 8:
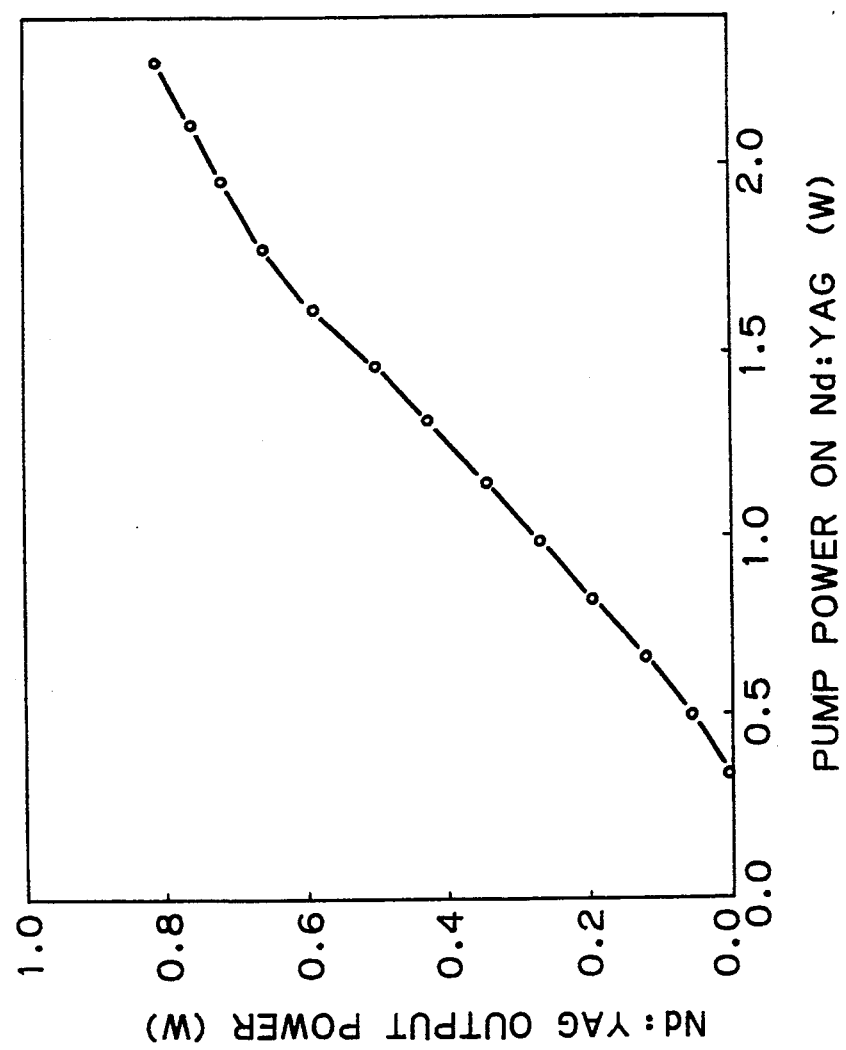
FIG. 8 is a graph showing the output power of the semiconductor laser array-pumped solid state laser of FIG. 7.

As shown in FIG. 8, in the semiconductor laser array-pumped solid state laser system, 810 mW of Nd:YAG output power is obtained under pumping power of 2.27 W.

FIG. 9 is a schematic diagram of a semiconductor laser array-end-pumped solid state laser system according to another embodiment of the present invention.

In FIG. 9, semiconductor laser arrays $14_1$ to $14_n$, GRIN lens arrays $18_1$ to $18_n$, aspherical lenses $20_1$ to $20_n$ and optical fibers $32_1$ to $32_n$ are the same as the semiconductor laser array 14, the GRIN lens array 18, the aspherical lens 20 and the optical fiber 32 of FIG. 7.

Other ends 40 not coupled with the semiconductor laser arrays $14_1$ to $14_n$ in the optical fibers $32_1$ to $32_n$ are bundled and the two-dimensionally arranged lens bundles 42 are located so that the optical axis of each optical fiber coincides with optical axis of each lens. Light beams output from the ends 40 of the optical fibers $32_1$ to $32_n$ are collimated in the lens bundle 42 and are converged in a lens 44 to thereby pump the solid state laser 10.

We claim:

1. A semiconductor laser-pumped solid state laser system comprising:
  a resonator means including a solid state laser;
  a semiconductor laser means including a semiconductor laser array having a plurality of active laser stripes for outputting a plurality of light beams, respectively;
  a condensing means, optically coupled with the semiconductor laser means, said condensing means including a gradient index lens array having a plurality of gradient index lenses located so that light beams output from the respective active layer stripes of the semiconductor laser array are collimated, for condensing the respective light beams from the respective active laser stripes of the semiconductor laser means to form condensed light beams not overlapping each other; and
  a converging means, optically coupled with the condensing means, for converging the condensed light beams on an end face of the solid state laser, to thereby optically pump the solid state laser.

2. A semiconductor laser-pumped solid state laser system, as claimed in claim 1, wherein the converging means includes an aspherical lens, made so that spherical aberration does not occur, for converging the light beams into a beam spot to thereby optically pump the solid state laser.

3. A semiconductor laser-pumped solid state laser system, as claimed in claim 1, wherein the semiconductor laser means includes a semiconductor laser array stack having a plurality of semiconductor laser arrays stacked, the semiconductor laser array having a plurality of active layer stripes each for outputting stripes the light beam, and wherein the condensing means includes a gradient index lens array stack having a plurality of gradient index lens arrays each having a plurality of gradient index lenses located so that light beams output from the respective active layer stripes of the semiconductor laser array stack are collimated.

4. A semiconductor laser-pumped solid state laser system, as claimed in claim 1, wherein
the semiconductor laser means includes a first semiconductor laser group and a second semiconductor laser group, and wherein
the condensing means includes a first condenser group for condensing the light beams from the active portions of the first semiconductor laser group and a second condenser group for condensing the light beams from the active portions of the second semiconductor laser group, further comprising
a mixing means for mixing the light beams condensed in the first condenser group with the light beams condensed in the second condenser group to supply the converging means with the mixed light beams.

5. A semiconductor laser-pumped solid state laser system as claimed in claim 4, wherein the solid state laser is end-pumped by the light beams from the first and the second semiconductor laser groups.

6. A semiconductor laser-pumped solid state laser system, as claimed in claim 4, wherein
the mixing means includes a polarization beam splitter mixing light beams having different polarization directions from each other, and wherein
the first and the second semiconductor groups and the first and the second condenser groups are arranged so as to supply light beams having different polarization directions from each other to the polarization beam splitter.

7. A semiconductor laser-pumped solid state laser system, as claimed in claim 4, wherein the first and the second semiconductor laser groups include semiconductor laser arrays having a plurality of active layer stripes each for outputting the light beam, and wherein the first and the second condenser groups includes a gradient index lens arrays having a plurality of gradient index lenses located so that light beams output from the respective active layer stripes of the semiconductor laser arrays are collimated.

8. A semiconductor laser-pumped solid state laser system, as claimed in claim 4, wherein the converging means includes an aspherical lens made so that spherical aberration does not occur, for converging the light beams into a beam spot to thereby optically pump the solid state laser.

9. A semiconductor laser-pumped solid state laser system, as claimed in claim 4, wherein the first and the second semiconductor laser groups include semiconductor laser array stacks having a plurality of semiconductor laser arrays stacked; the semiconductor laser array having a plurality of active layer stripes for each output of the light beam, and wherein the first and the second condenser groups include gradient index lens array stacks having a plurality of gradient index lens arrays each having a plurality of gradient index lenses located so that the light beams output from the respective active layer stripes of the semiconductor laser array stacks are collimated.

10. A semiconductor laser-pumped solid state laser system, as claimed in claim 1, further comprising:
a beam shaping means, inserted between the condensing means and the converging means for shaping cross sections of the light beams so that the intensity distribution in the cross sections approaches the rotation symmetrical distribution.

11. A semiconductor laser-pumped solid state laser system, as claimed in claim 10, wherein the solid state laser is end-pumped by the light beams from the semiconductor laser means.

12. A semiconductor laser-pumped solid state laser system, as claimed in claim 10, wherein the beam shaping means includes an anamorphic prism pair.

13. A semiconductor laser-pumped solid state laser system, as claimed in claim 10, wherein the semiconductor laser means includes a semiconductor laser array having a plurality of active layer stripes each for outputting the light beam, and wherein the condensing means includes a gradient index lens array having a plurality of gradient index lenses located so that light beams output from the respective active layer stripes of the semiconductor laser array are collimated.

14. A semiconductor laser-pumped solid state laser system, as claimed in claim 10, wherein the converging means includes an aspherical lens made so that spherical aberration does not occur, for converging the light beams into a beam spot to thereby optically pump the solid state laser.

15. A semiconductor laser-pumped solid state laser system, as claimed in claim 1, further comprising:
an optical fiber means optically connected with the converging means and the solid state laser.

16. A semiconductor laser-pumped solid state laser system, as claimed in claim 15, wherein the solid state laser is end-pumped by the light beams from the semiconductor laser means.

17. A semiconductor laser-pumped solid state laser system, as claimed in claim 15, wherein the semiconductor laser means includes a semiconductor laser array having a plurality of active layer stripes each for outputting the light beam, and wherein the condensing means includes a gradient index lens array having a plurality of gradient index lenses located so that light beams output from the respective active layer stripes of the semiconductor laser array are collimated.

18. A semiconductor laser-pumped solid state laser system, as claimed in claim 15, wherein the converging means includes an aspherical lens made so that spherical aberration does not occur, for converging the light beams into a beam spot to thereby optically pump the solid state laser.

19. A semiconductor laser-pumped solid state laser system, as claimed in claim 15, wherein
the semiconductor laser means comprises a plurality of semiconductor laser arrays having a plurality of active portions each for outputting the light beam, wherein
the condensing means comprises a plurality of gradient index lens arrays each having a plurality of gradient index lenses located so that light beams output from the respective active portions of each semiconductor laser array are collimated, wherein
the converging means comprises a plurality of spherical lenses for converging the light beams condensed in the gradient index lens arrays, respectively, and wherein
the optical fiber means comprises a plurality of optical fibers coupled with the aspherical lenses, respectively, in one end of the optical fibers and bundled in other ends of the optical fibers further comprising
a lens bundle having a plurality of lenses located so that the optical axes thereof coincide with the optical axes of the optical fibers and
a lens for converging light beams from the lens bundle to thereby pump the solid state laser.

20. An optical coupling system for coupling a semiconductor laser with an optical fiber; the semiconductor laser element including a semiconductor laser array having a plurality of active laser stripes for outputting a plurality of light beams, respectively, comprising:
 a condensing means, optically coupled with the semiconductor laser element, said condensing means including a gradient index lens array having a plurality of gradient index lenses located so that light beams output from the respective active layer stripes of the semiconductor laser array are collimated, for condensing the respective light beams from the respective active laser stripes of the semiconductor laser element to form condensed light beams not overlapping each other; and
 a converging means, optically coupled with the condensing means and containing optical fiber, for converging the condensed light beams on an end face of the optical fiber and for supplying the optical fiber with the converged light beams.

21. An optical coupling system, as claimed in claim 20, wherein the converging means includes an aspherical lens made so that spherical aberration does not occur, for converging the light beams into a beam spot to couple with the optical fiber.

* * * * *